United States Patent
Li et al.

(10) Patent No.: US 8,558,615 B2
(45) Date of Patent: Oct. 15, 2013

(54) APPARATUS FOR AND METHOD OF CONTROLLING A PREDISTORTER, AND METHOD OF DETECTING POWER CONTROL STATE

(75) Inventors: Hui Li, Beijing (CN); Takanori Iwamatsu, Kanagawa (JP); Jianmin Zhou, Beijing (CN)

(73) Assignee: Fujitsu Limited, Kawasaki (JP)

( * ) Notice: Subject to any disclaimer, the term of this patent is extended or adjusted under 35 U.S.C. 154(b) by 70 days.

(21) Appl. No.: 13/174,067

(22) Filed: Jun. 30, 2011

(65) Prior Publication Data

US 2012/0133433 A1   May 31, 2012

(30) Foreign Application Priority Data

Nov. 30, 2010   (CN) .......................... 2010 1 0568289

(51) Int. Cl.
*H03F 1/26*   (2006.01)
(52) U.S. Cl.
USPC ....................................................... 330/149
(58) Field of Classification Search
USPC ................. 330/149; 375/296, 297; 455/114.3
See application file for complete search history.

(56) References Cited

U.S. PATENT DOCUMENTS

| | | | |
|---|---|---|---|
| 5,867,065 A * | 2/1999 | Leyendecker | 330/149 |
| 7,392,020 B2 * | 6/2008 | Maniwa et al. | 330/149 |
| 7,551,687 B2 * | 6/2009 | Ode et al. | 375/296 |
| 7,737,779 B2 * | 6/2010 | Summerfield et al. | 330/149 |
| 7,973,601 B2 * | 7/2011 | Hamano | 330/149 |
| 8,111,101 B2 * | 2/2012 | Brown et al. | 330/149 |

* cited by examiner

*Primary Examiner* — Khanh V Nguyen
(74) *Attorney, Agent, or Firm* — Arent Fox LLP

(57) ABSTRACT

This invention relates to an apparatus for and a method of controlling a predistorter, and a method of detecting power control state. The method of controlling a predistorter, which is for predistorting a signal input into a power amplifier, comprises storing predistortion coefficients used by the predistorter; acquiring indices each indicative of an output power of the power amplifier; detecting, based on the indices acquired in the acquiring, whether the power amplifier is in a state of undergoing power control; and supplying the stored predistortion coefficients to the predistorter when it is detected that the power amplifier is in the state of undergoing power control, or supplying, when it is detected that the power amplifier is not in the state of undergoing power control, to the predistorter predistortion coefficients calculated by a unit that performs predistortion coefficient adaptive updating operation.

10 Claims, 8 Drawing Sheets

US 8,558,615 B2

APPARATUS FOR AND METHOD OF CONTROLLING A PREDISTORTER, AND METHOD OF DETECTING POWER CONTROL STATE

FIELD OF THE INVENTION

This invention relates to a power amplifier (hereinafter shortened as "PA"). This invention relates to adaptive digital predistortion control of a PA.

BACKGROUND OF THE RELATED ART

A method that effectively corrects PA nonlinearity, adaptive digital predistortion (DPD) technology has now been widely applied in wireless communication transmission systems.

FIG. 1 is a block diagram illustrating the principles of a known PA system. As shown in FIG. 1, after passing through a digital predistorter 102, a predistorted signal is obtained for baseband signal source information x(n) from signal source 101, and the predistorted signal is converted into an analogue signal via a digital-to-analogue (D/A) converter 103. After this analogue signal is up-converted into a radio frequency signal via up-frequency converter 104, it is inputted into an analogue variable gain attenuator (VGA) 105, whereby it is gain-adjusted and then input into a power amplifier 106. The signal amplified by power amplifier 106 is transmitted via an antenna. At the same time, a part of the signal output from the power amplifier 106 is down-converted via a down-frequency converter 107 and then fed back to an analogue-to-digital converter 108, whereby it is sampled by the analogue-to-digital converter 108 to obtain a feedback PA output digital baseband signal. This baseband signal is analyzed using digital signal processing technology in an out-band power calculating module 109 to obtain an out-band power value of this digital baseband signal. Thereafter in a predistorter coefficient updating unit 110, the out-band power value is optimized as a target function, and the coefficient of the predistorter is updated using an updating algorithm, to thereby achieve the process of adaptive predistortion.

There is usually demand for power control in any communication system. Power control is generally achieved by adjusting the analogue variable gain attenuator (VGA) which is placed upstream of PA. This means that the output from predistorter 102 should be first regulated via the variable gain attenuator in order to be input to PA. Although power control does not change the real characteristics of PA, analogue link nonlinearity downstream of the output terminal of the predistorter is changed relative to the output terminal of the predistorter. Thus, once power control is carried out, it is required for the predistorter 102 to be regulated in real time to track the change in nonlinearity. But it takes some time for convergence of the updating algorithm in the adaptive predistorter coefficient updating unit 110, and the time for convergence is particularly longer when a scalar predistorter is used—when the communication system performs continuous and fast power control, it is difficult for the predistorter 102 and the predistorter coefficient updating unit 110 to catch up with the change in link nonlinearity, whereby performance of the system is deteriorated.

SUMMARY OF THE INVENTION

This invention is proposed in view of the aforementioned problems in the prior art, to solve one or more deficiencies that exist in the prior art, and provide at least one advantageous choice.

According to one aspect of the present invention, there is provided a method of controlling a predistorter for predistorting a signal input into a power amplifier, which method comprises storing predistortion coefficients used by the predistorter; acquiring indices each indicative of an output power of the power amplifier; detecting, based on the indices acquired in the acquiring, whether the power amplifier is in a state of undergoing power control; and supplying the stored predistortion coefficients to the predistorter when it is detected that the power amplifier is in the state of undergoing power control, or supplying, when it is detected that the power amplifier is not in the state of undergoing power control, to the predistorter predistortion coefficients calculated by a unit that performs predistortion coefficient adaptive updating operation.

According to another aspect of the present invention, there is provided a method of detecting power control state, for detecting whether a power amplifier is in a state of undergoing power control, which method comprises registering a plurality of indices which are acquired within a predetermined time period, each index indicating an output power of the power amplifier; acquiring a difference between a maximum value and a minimum value within the plurality of indices; determining, based on the difference, whether the power amplifier is in the state of undergoing power control; and outputting a signal indicating whether the power amplifier is in the state of undergoing power control.

According to still another aspect of the present invention, there is provided an apparatus for controlling a predistorter for predistorting a signal input into a power amplifier, which apparatus comprises a storing unit, for storing a predistortion coefficient used by the predistorter; an index acquiring unit, for acquiring indices indicative of an output power of the power amplifier; a power control state detecting unit, for detecting, based on the indices acquired by the index acquiring unit, whether the power amplifier is in a state of undergoing power control; and a coefficient supplying unit, for obtaining the stored predistortion coefficient for supply to the predistorter when the power control state detecting unit detects that the power amplifier is in the state of undergoing power control, and for supplying, when it is detected that the power amplifier is not in the state of undergoing power control, to the predistorter predistortion coefficients calculated by a unit that performs predistortion coefficient adaptive updating operation.

According to embodiments of the present invention, the operation modes of the PA system are judged such that, if the PA system is in the power control mode, the coefficient of the predistorter will be read from a coefficient memory, and if the PA system operates under a tracking mode without power control, an updating algorithm will be initiated to track the change in the current link nonlinearity, whereby system performance of the power amplifier can be effectively improved.

BRIEF DESCRIPTION FOR THE DRAWINGS

To make more apparent the embodiments of the present invention or technical solutions in the prior art, drawings necessary to illustrate the embodiments or the prior art are briefly described below. Obviously, the drawings described below are merely directed to some embodiments of the present invention, and it is possible for persons ordinarily skilled in the art to deduce other drawings from these drawings without creative effort.

Figure 7:
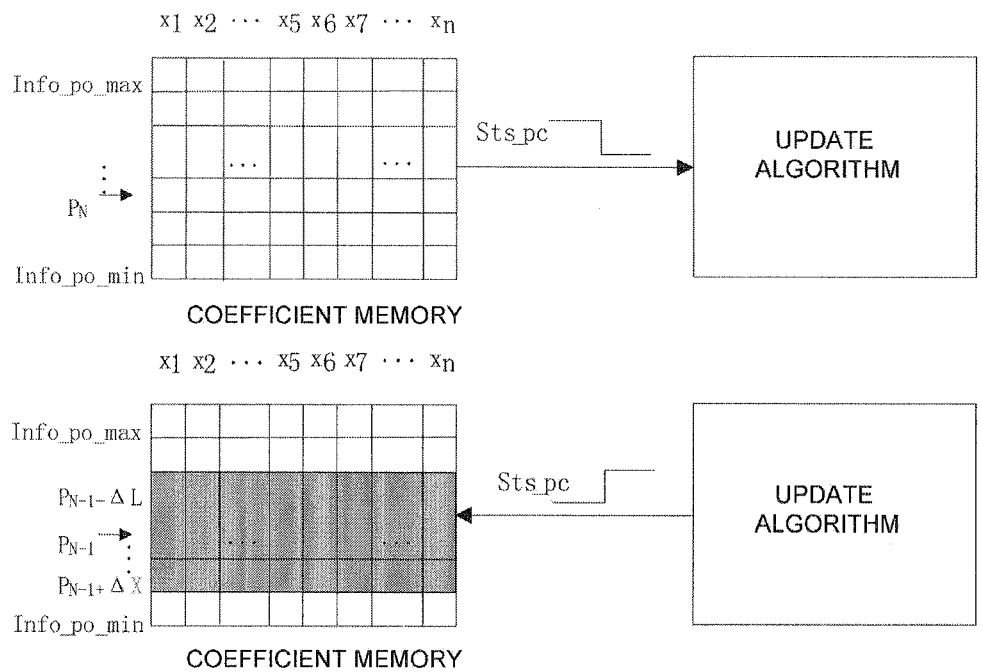

FIG. 7 schematically illustrates the structure of a coefficient storing unit storing predistorter coefficients and its relation to an updating algorithm used in a predistorter coefficient updating unit according to the embodiments of the present invention.

Figure 8:
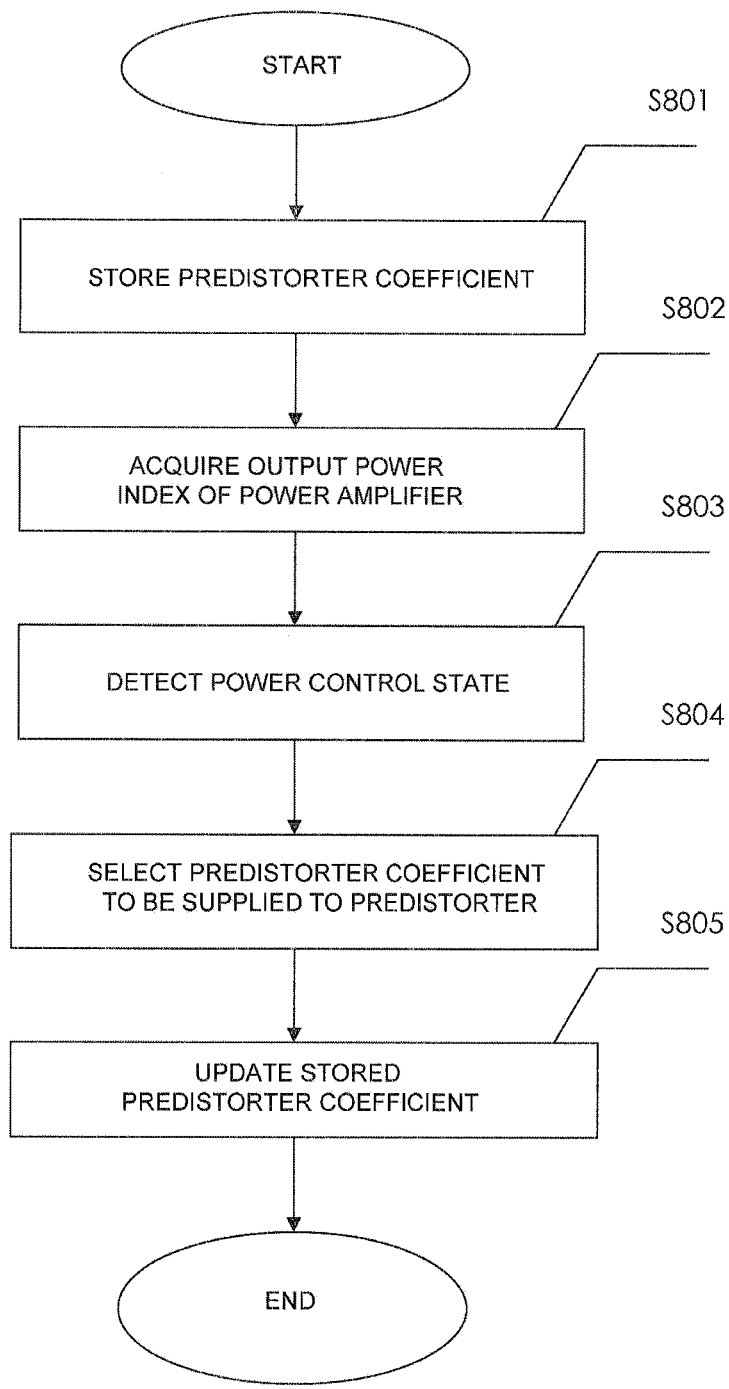

FIG. 8 is a flowchart illustrating a method of controlling a digital predistorter according to one embodiment of the present invention.

DETAILED DESCRIPTION OF THE INVENTION

Embodiments of the present invention are described in greater detail below with reference to the accompanying drawings. For the sake of clarity and brevity, descriptions descriptive of prior-art component parts that might cause unclarity to the present invention are omitted in this document. In addition, the same or similar component parts are indicated by the same reference numerals, and repetitive descriptions thereof are omitted in this document.

Figure 1:
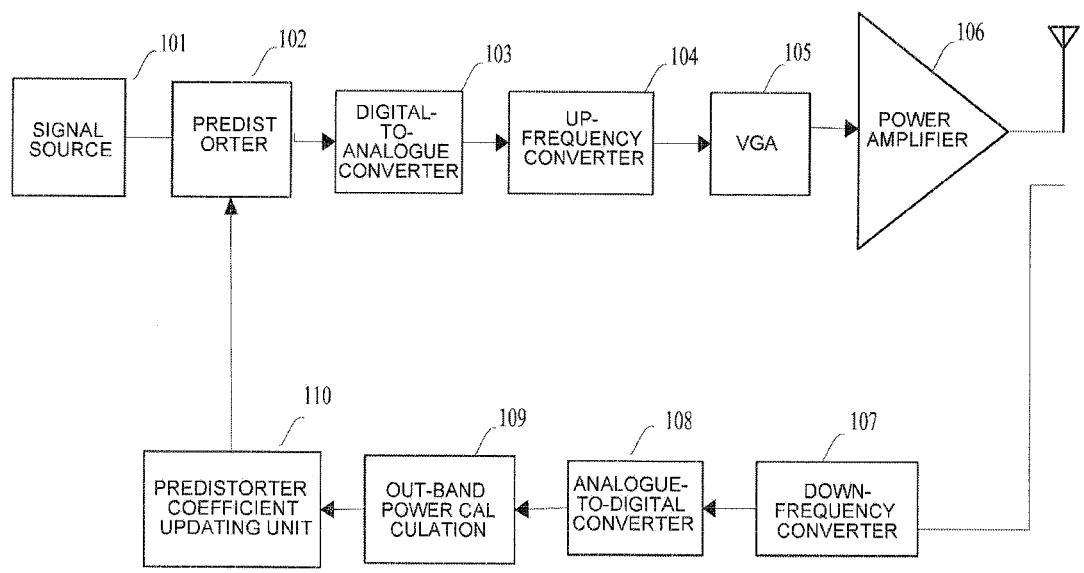
FIG. 1 is a block diagram illustrating the principles of a known PA system.
Figure 2:
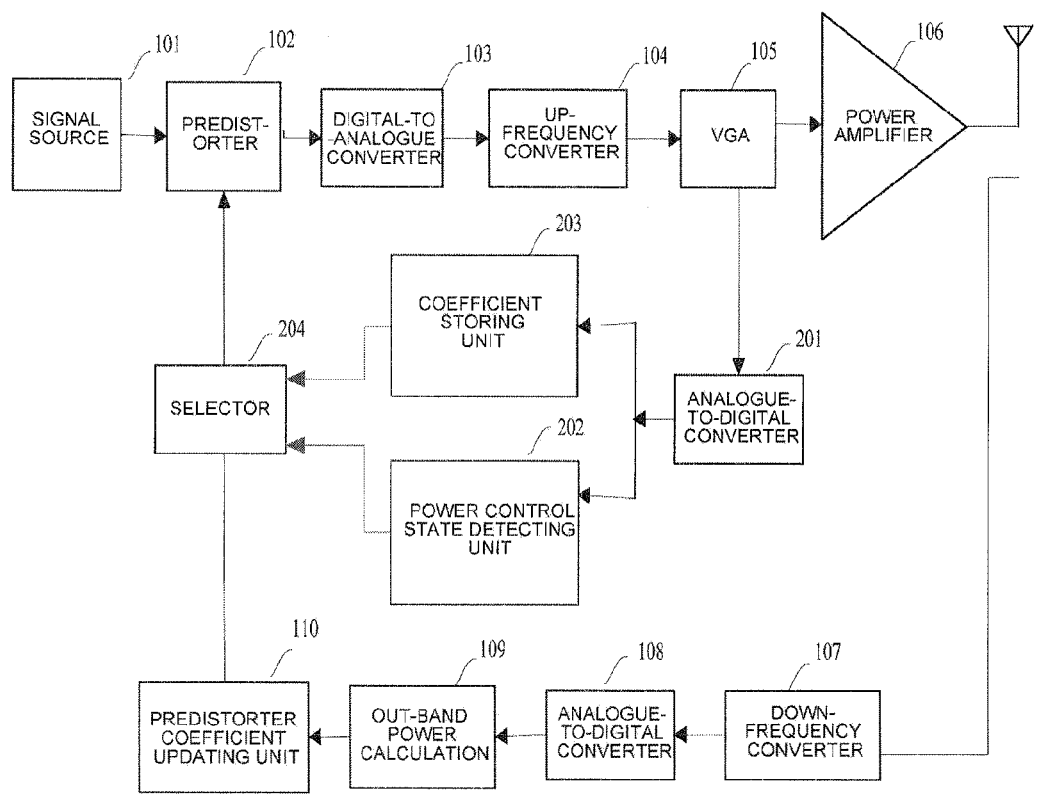
FIG. 2 is a schematic block diagram illustrating the function of a PA system according to one embodiment of the present invention.

FIG. 2 is a schematic block diagram illustrating the function of a PA system according to one embodiment of the present invention. In comparison with FIG. 1, added to the PA system according to one embodiment of the present invention as shown in FIG. 2 are an analogue-to-digital converter 201, a power control state detecting unit 202, a coefficient storing unit 203 and a selector 204. As the remaining component parts are the same as those in FIG. 1, they are not repetitively described in this context.

Analogue-to-digital converter (ADC) 201 samples the output from VGA 105 with sampling rate Sa to obtain discrete signal Info_po, and inputs the signal to the power control state detecting unit. It is required here that sampling rate Sa of the analogue-to-digital converter 201 be greater than the system power control rate. Based on discrete signal Info_po input by the analogue-to-digital converter 201, the power control state detecting unit 202 judges the power control state of the PA system, and outputs operation state indication signal Sts_pc. In one embodiment, operation state indication signal Sts_pc indicates two states. In the case Sts_pc=0, it is indicative that the system operates under the tracking mode, namely a state of not currently performing power control. In the case Sts_pc=1, it is indicative that the system operates under the power control mode, namely a state of currently performing power control. Specific implementation and specific operation of the power control state detecting unit will be described later.

Coefficient storing unit 203 stores predetermined predistorter coefficients corresponding to each Info_po value. The initial value of predistorter coefficients stored in the coefficient storing unit 203 can be obtained either via offline convergence or via training by gradually increasing the VGA value during the starting-up phase of the system.

Selector 204, based on operation state indication signal Sts_pc from the power control state detecting unit 202, selects whether to read in predistorter 102 the predistorter coefficients stored in the coefficient storing unit 203, or to read in predistorter 102 the predistorter coefficients converged in real time in the predistorter coefficient updating unit 110. Selector 204 is an embodiment of the coefficient supplying unit of the present invention. When Sts_pc signal indicates that the system operates under the power control mode (Sts_pc=1 in this embodiment, for instance), the selector 204 selects a predistorter coefficient that comes from the coefficient storing unit 203 and that corresponds to the current Info_po signal value. When Sts_pc signal indicates that the system operates under the tracking mode (Sts_pc=0 in this embodiment, for instance), the selector 204 selects a predistorter coefficient that comes from the predistorter coefficient updating unit 110 and that is converged in real time. By this time, the predistorter coefficient updating unit obtains the real-time predistorter coefficient by converging the out-band power input by a feedback loop as a cost function, for instance.

Figure 3:
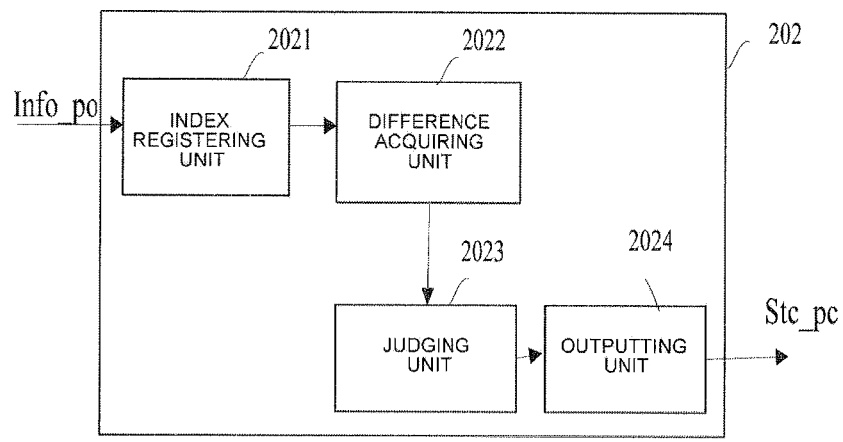
FIG. 3 is a schematic block diagram illustrating the function of a power control state detecting unit according to one embodiment of the present invention.

FIG. 3 is a block diagram exemplarily illustrating the function of a power control state detecting unit according to one embodiment of the present invention.

As shown in FIG. 3, the power control state detecting unit 202 according to one embodiment of the present invention includes an index registering unit 2021, a difference acquiring unit 2022, a judging unit 2023 and an outputting unit 2024.

Index registering unit 2021 acquires a plurality of indices within a predetermined time period, each index indicating an output power of the amplifier.

In one embodiment, the index registering unit 2021 makes use of a shift register, for example, to register the current Info_po (marked as PN) from the analogue-to-digital converter 201, and N−1 consecutive Info_poes (respectively marked as PN−1, PN−2 . . . P2, P1) previous to this Info_po. N may be a predetermined natural number. Since each Info_po is obtained by sampling the output from VGA, its value has a known predetermined relation to the output power of the power amplifier, so that the value can be used to represent the output power of the power amplifier.

In one embodiment, the number N of the obtained Info_po satisfies the following Expression (1):

$$N >= Twd \times Sa \quad (1)$$

where Twd is the convergence time of the updating algorithm used in the predistorter coefficient updating unit, and Sa is the sampling rate of the analogue-to-digital converter 201 that samples VGA.

Expression (1) indicates that the N registered indices are obtained at a time period that is longer than or equal to the convergence time of the updating algorithm, so that the judgment result of the power control state can be better adapted to the updating algorithm.

Each time the ADC 201 inputs an Info_po to the power control state detecting unit (specifically, the index registering unit 2021), the difference acquiring unit 2022 calculates a difference P_high−P_low between the maximum value P_high (P_high=max(P1, P2, . . . , PN)) and the minimum value P_low (P_low=min(P1, P2, . . . , PN)) in the N indices (N Info_poes in this embodiment) obtained in the index registering unit 2021.

Judging unit 2023, based on the difference P_high−P_low obtained by the difference acquiring unit 2022, judges whether the power amplifier system is under the tracking state or under the power control state, and sets the value of the corresponding operation state indication signal.

In one embodiment, the judging unit 2023 judges whether the difference P_high−P_low obtained by the difference acquiring unit 2022 is greater than a predetermined threshold value thd. In the case P_high−P_low>thd, it is judged that the system is currently under the power control state, by which time indication signal Sts_pc is equal to 1. In the case P_high−P_low<=thd, after it is judged, in a preferred embodiment, that P_high−P_low is less than or equal to thd, the judging unit 2023 further judges whether the state of P_high−P_low<=thd has continued for certain time, for instance, whether P_high−P_low<=thd has been judged consecutively for M times (M is a predetermined natural number). In one embodiment, M satisfies the following Expression (2):

$$M >= Twd \times Sa \qquad (2)$$

in one embodiment, M=N.

If the state of P_high−P_low<=thd has continued for certain time—that is to say, plural differences obtained by the difference acquiring unit within a particular time are all less than or equal to the predetermined threshold value thd—it is determined that the system is under the tracking mode, and Stc_pc is set to be 0.

Outputting unit 2024 outputs a signal (Stc_pc) indicating whether the amplifier is currently undergoing power control.

Figure 4:
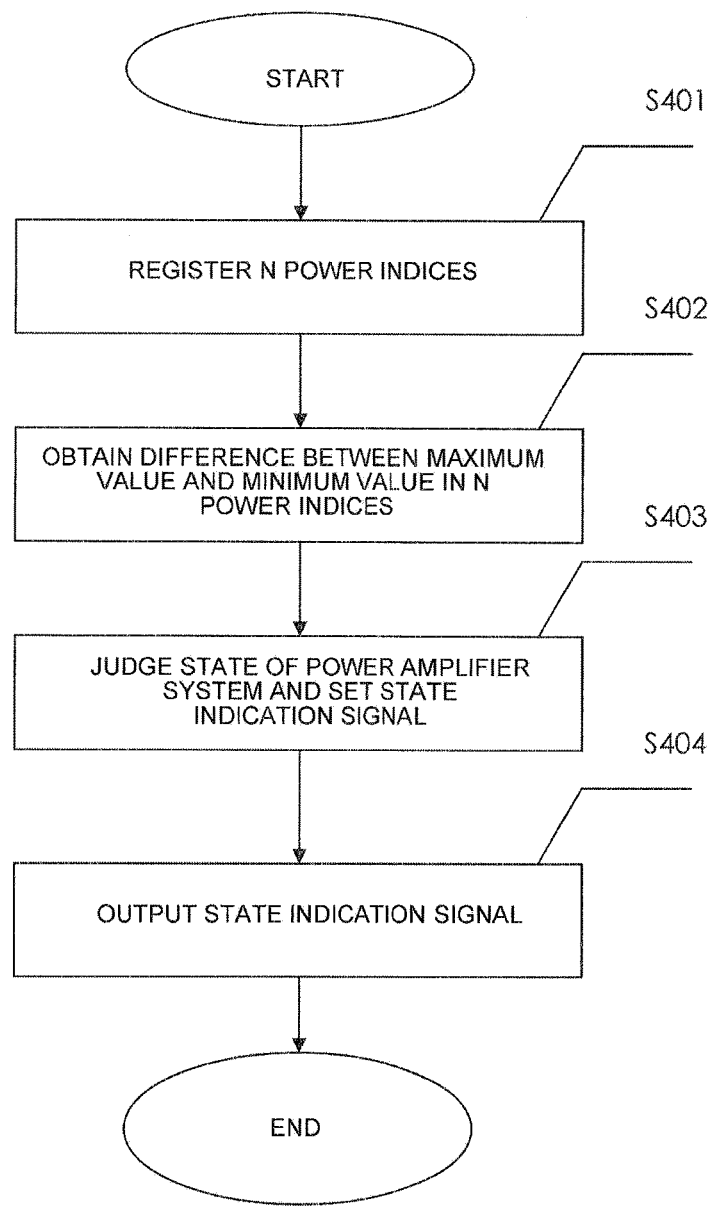
FIG. 4 is a schematic flowchart illustrating the operation of a power control state detecting unit performing power control state detection according to one embodiment of the present invention.
Figure 5:
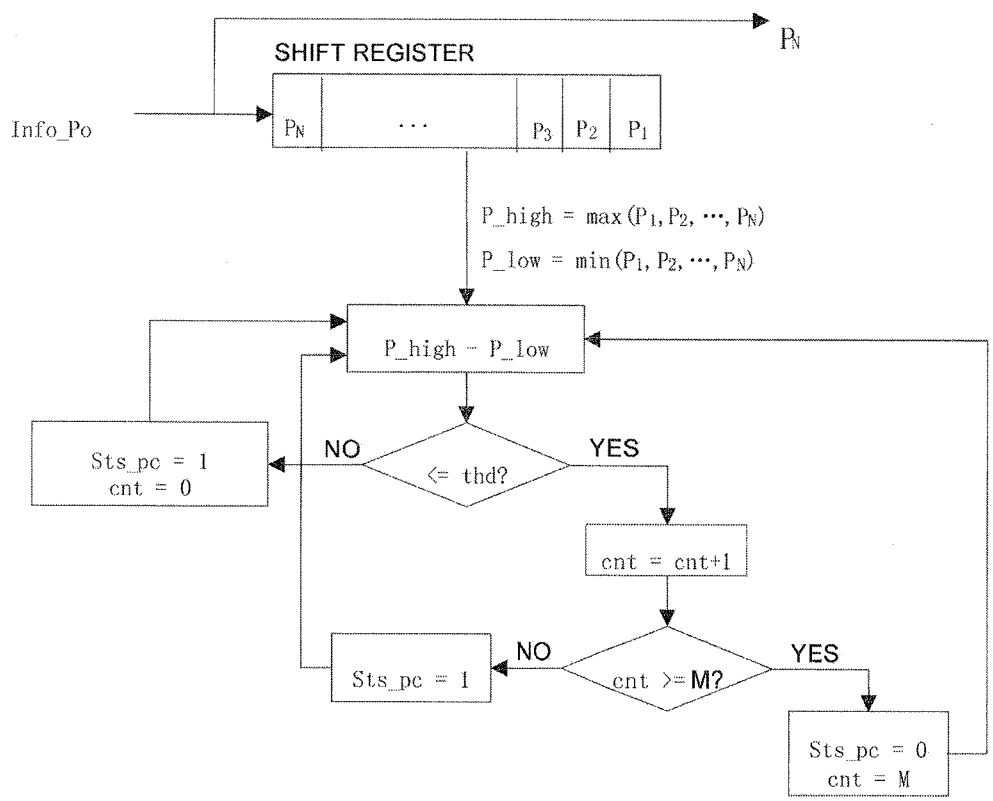
FIG. 5 is a schematic flowchart illustrating specific implementation of various steps in the flowchart of FIG. 4.

FIG. 4 is a schematic flowchart illustrating the operation of a power control state detecting unit performing power control state detection according to one embodiment of the present invention. FIG. 5 is a schematic flowchart illustrating specific implementation of various steps in the flowchart of FIG. 4.

As shown in FIG. 4 and FIG. 5, N power indices are firstly obtained and registered in Step S401. In one specific embodiment, the index registering unit 2021 makes use of a shift register, for example, to register N consecutive Info_poes (respectively marked as PN, PN−1, PN−2 . . . P2, P1) from the analogue-to-digital converter 201. The difference between the maximum value and the minimum value in the N power indices is subsequently obtained in Step S402. For instance, in a specific embodiment, the difference acquiring unit 2022 calculates $$P\_high = \max(P1, P2, \ldots, PN)$$

$$P\_low = \min(P1, P2, \ldots, PN)$$

$$P\_high - P\_low, \text{as shown in FIG. 5.}$$

Thereafter in Step S403, the state of the power amplifier system is judged (as to whether in the state of power regulation), and a value of the corresponding operation state indication signal is set. Specifically as shown in FIG. 5, it is judged in one embodiment whether P_high−P_low is greater than thd or not. If P_high−P_low is greater than thd, it is judged that the system is in the state of power control, and the time indication signal Sts_pc is set to be equal to 1, and a counter cnt is set to zero (the initial value of the count cnt is zero) at the same time. If P_high−P_low is less than or equal to thd, the count cnt adds by 1, and it is simultaneously judged whether cnt is greater than or equal to M at this time. If cnt is less than M, it is judged that the current system is still in the power control mode, and indication signal Sts_pc is equal to 1. If cnt is greater than or equal to M, it is indicative that there have already been M consecutive signals that satisfy the threshold range by this time, the system is judged to be in the tracking mode, and state indication signal Sts_pc is set to be equal to zero. Moreover, to avoid overflow of the counter cnt, it is maintained that cnt be equal to M.

Finally in Step S404, operation state indication signal Sts_pc is output.

Figure 6:
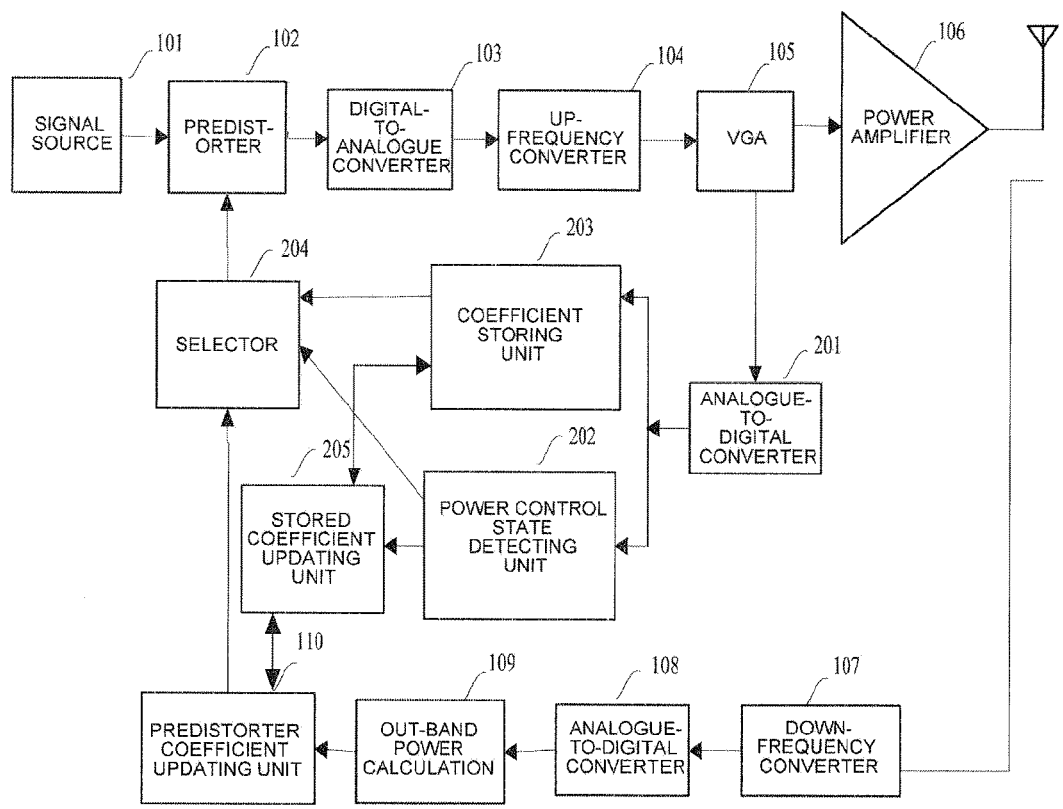
FIG. 6 is a schematic block diagram illustrating the function of a PA system according to another embodiment of the present invention.

FIG. 6 is a schematic block diagram illustrating the function of a PA system according to another embodiment of the present invention. The PA system according to the embodiment shown in FIG. 6 is essentially the same in structure as the PA system according to the embodiment shown in FIG. 2, but is added with a stored coefficient updating unit 205. Specifically, in the PA system according to the embodiment shown in FIG. 6, when Sts_pc signal indicates that the system is switched from the power control mode to the tracking mode, the stored coefficient updating unit transmits the predistorter coefficient, which comes from the coefficient storing unit and which corresponds to the current Info_po, to the predistorter coefficient updating unit 110 as the initial value of the updating algorithm, and the selector 204 transmits to the predistorter 102 the parameters of the predistorter calculated and obtained by the predistorter coefficient updating unit 110 when the PA system is in the tracking mode. When Sts_pc signal indicates that the system is switched from the tracking mode to the power control mode, the stored coefficient updating unit 205 writes into the coefficient storing unit 203 the predistorter coefficient, which comes from the predistorter coefficient updating unit 110, which is converged and obtained by an algorithm, and which corresponds to the Info_po of the previous timing.

In one embodiment, when the stored coefficient updating unit 205 writes into the coefficient storing unit 203 the predistorter coefficient, which comes from the predistorter coefficient updating unit 110, which is converged and obtained by an algorithm, and which corresponds to the Info_po of the previous timing, only the predistorter coefficient corresponding to the previous Info_po (namely PN−1) in the coefficient storing unit 203 is updated as the predistorter coefficient coming from the predistorter coefficient updating unit 110 and corresponding to the previous Info_po (namely PN−1).

In another embodiment, when the stored coefficient updating unit 205 writes into the coefficient storing unit 203 the predistorter coefficient, which comes from the predistorter coefficient updating unit 110, which is converged and obtained by an algorithm, and which corresponds to the Info_po of the previous timing, not only the predistorter coefficient corresponding to the previous Info_po (namely PN−1) in the coefficient storing unit 203 is updated as the predistorter coefficient coming from the predistorter coefficient updating unit 110 and corresponding to the previous Info_po (namely PN−1), but also the predistorter coefficient corresponding to several adjacent power indices close to the previous Info_po (namely PN−1) in the coefficient storing unit 203 is updated as the predistorter coefficient coming from the predistorter coefficient updating unit 110 and corresponding to the previous Info_po (namely PN−1).

FIG. 7 exemplarily illustrates the structure of a coefficient storing unit storing predistorter coefficients and its relation to an updating algorithm used in the predistorter coefficient updating unit according to the embodiments of the present invention. Suppose that the operation range of VGA be from the minimum value of Info_po_min to the maximum value of Info_po_max, and the predistorter coefficients be x1, 2, . . . , xn. As previously mentioned, under the initial condition, predistorter coefficients corresponding to each power and within the range from Info_po_min to Info_po_max can be obtained by offline test or training at the starting-up. When indication signal Sts_pc indicates that the system operates under the power control mode, a set of predistorter coefficients is searched out based on the current Info_po (PN) value. When indication signal Sts_pc indicates the forthcoming of the trailing edge, it is indicative that the system is switched from the power control mode to the tracking mode.

At this time, the predistorter coefficient that corresponds to the current PN value is input into the updating algorithm as the initial value of the algorithm. Under the tracking mode, the updating algorithm is always operating to track the slow change in the PA nonlinearity caused by factors such as temperature aging. When indication signal Sts_pc indicates the forthcoming of the rising edge, it is indicative that the system is switched from the tracking mode to the power control mode, by which time the updating algorithm should be stopped, and predistorter coefficients that have been converged are stored in the coefficient memory at the same time. According to one embodiment of the present invention, the coefficient storing operation at this time is based on the power index value PN−1 of the previous timing, and the predistorter coefficient corresponding thereto as well as the predistorter coefficients corresponding to several adjacent power index values (PN−1−ΔL, PN−1−Δ(L−1), . . . , PN−1, PN−1+Δ, . . . , PN−1+Δ(X−1), PN−1+ΔX) close to PN−1 are all updated as the converged predistorter coefficients, while the remaining predistorter coefficients remain unchanged. Here, Δ is the power interval of a coefficient memory table, and numbers L and X of adjacent powers are determined by characteristics of the specific power amplifier (PA). For instance, the value of L in one embodiment can be set as zero, and it is set PN−1+ΔX=Info_po_min. In other words, predistorter coefficients that correspond to power index values lower than PN−1 are all changed to predistorter coefficients that correspond to the power index value of PN−1.

FIG. 8 is a flowchart illustrating a method of controlling a digital predistorter according to one embodiment of the present invention. As shown in FIG. 8, predistorter coefficients are firstly stored in Step S801. As previously mentioned, the predistorter coefficients as stored can be obtained by offline test or training at the starting-up. In addition, as discussed above, these predistorter coefficients can be stored in the form of a table corresponding to the output power indices of the power amplifier. As should be noted, however, the step of storing the predistorter coefficients can be performed prior to application of the amplifier system to the market or prior to normal operation, as it is not necessary to perform the step before each starting-up. Subsequently in Step S802, the output power index of the power amplifier is obtained. In one embodiment, for instance, the output power index can be obtained by using the ADC converter to sample the output from VGA. Then in Step S803, the operation state of the power amplifier is judged (as to whether the power amplifier is in the state of power control) according to the output power index of the power amplifier obtained in Step S802, and operation state indication signal (the previously mentioned Stc_pc, for example) indicative of the operation state of the power amplifier is output. Thereafter in Step S804, predistorter coefficients to be supplied to the predistorter are selected according to the state indication signal output from Step S803. Specifically, when the power amplifier is in the state of power control, predistorter coefficients as stored and corresponding to the current power index are selected for supply to the predistorter to be controlled; when the power amplifier is not in the power control state (namely in the tracking state), predistorter coefficients calculated in real time by the updating algorithm of the predistorter coefficient updating unit are selected for supply to the predistorter to be controlled.

Additionally, when the power amplifier system is switched from the tracking mode to the power control mode, the predistorter coefficient, which is converged and obtained by the updating algorithm and which corresponds to the output power index (Info_po, for example) of the power amplifier of the previous timing, is written into the coefficient storing unit 203 in Step S805. The writing-in can for example be performed by the two methods as mentioned above.

The above descriptions to the embodiments of the present invention are all exemplary in nature, rather than restrictive of the present invention. For example, in the above descriptions the out-band power of the PA output signal is used as the optimization target by the predistortion coefficient updating algorithm. However, in different embodiments, such scalar information as in-band/out-band power ratio can be used as the optimization target by the predistortion coefficient updating algorithm. In addition, other non-scalar information may as well be used as the optimization target by the predistortion coefficient updating algorithm. For further example, in the above descriptions of the embodiments of the present invention, the method of sampling the output from VGA is used to obtain the output power index of the power amplifier, but in different embodiments it is possible to directly obtain the output power itself of the power amplifier as the output power index of the power amplifier. Under such circumstance, it is possible to use a power measuring unit in place of the analogue-to-digital converter 201 described above. Both the power measuring unit and the analogue-to-digital converter 201 are examples of units that acquire the output power index of the amplifier.

As should be aware to persons ordinarily skilled in the art, various exemplary units and method steps described with reference to the embodiments disclosed in this paper can be implemented by hardware, by software or by the combination of hardware with software. Whether the functions should be executed by hardware or by software depends upon particular applications and restricting conditions for designs of the technical solutions. The skilled person may use different methods to implement the described functions with respect to each particular application, but such implementation shall not be considered as going beyond the scope of the present invention.

Method or algorithm steps described with reference to embodiments disclosed in this paper can be implemented by software that is executed by hardware (such logical devices as computer, and so on). When executed, the software enables the hardware (such logical devices as computer, and so on) to implement the aforementioned methods or constituent steps thereof, or enables the hardware (such logical devices as computer, and so on) to serve as component parts of the apparatuses according to the present invention as discussed above.

The software may be installed in any random access memory (RAM), internal memory, read-only memory (ROM), electrically programmable ROM, electrically erasable and programmable ROM, register, hard disk, mobile magnetic disk, CD-ROM, or any storage medium in random form publicly known in the art.

Accordingly, persons skilled in the art can base on the above descriptions to at least arrive at the following embodiments.

Excursus 1—a method of controlling a predistorter for predistorting a signal input into a power amplifier, which method comprises storing predistortion coefficients used by the predistorter; acquiring indices each indicative of an output power of the power amplifier; detecting, based on the indices acquired in the acquiring, whether the power amplifier is in a state of undergoing power control; and supplying the stored predistortion coefficients to the predistorter when it is detected that the power amplifier is in the state of undergoing power control, or supplying, when it is detected that the power amplifier is not in the state of undergoing power control, to the predistorter predistortion coefficients calculated by a unit that performs predistortion coefficient adaptive updating operation.

Excursus 2—the method according to Excursus 1, wherein the detecting includes registering a plurality of the indices which are acquired within a predetermined time period; acquiring a difference between a maximum value and a minimum value within the plurality of indices; determining, based on the difference, whether the power amplifier is in the state of undergoing power control; and outputting a signal indicating whether the power amplifier is in the state of undergoing power control.

Excursus 3—the method according to Excursus 2, wherein the predetermined time is greater than or equal to a converging time of an update algorithm of the unit that performs predistortion coefficient adaptive updating operation.

Excursus 4—the method according to Excursus 2, wherein an output from the predistorter is input into the power amplifier via a variable gain attenuator, wherein the plurality of indices are acquired in the acquiring by sampling an output from the variable gain attenuator.

Excursus 5—the method according to Excursus 2, wherein it is determined in the determining whether the difference is greater than a predetermined threshold; when the difference is greater than the predetermined threshold, it is determined that the power amplifier is in the state of undergoing power control; when the difference is not greater than the predetermined threshold, it is further determined in the determining whether a plurality of the differences acquired in the acquiring within a particular time are not greater than the predetermined threshold; when it is determined that the plurality of differences acquired in the acquiring within the particular time are not greater than the predetermined threshold, it is determined in the determining that the power amplifier is not in the state of undergoing power control.

Excursus 6—the method according to Excursus 1, wherein when it is detected in the detecting that the power amplifier is not in the state of undergoing power control, the supplying delivers the stored predistortion coefficients to the unit that performs predistortion coefficient adaptive updating operation, as an initial value for the unit that performs predistortion coefficient adaptive updating operation to perform the predistortion coefficient adaptive updating operation, and supplies to the predistorter the predistortion coefficient calculated by the unit that performs predistortion coefficient adaptive updating operation.

Excursus 7—the method according to Excursus 6, wherein when it is detected in the detecting that the power amplifier changes from the state of not undergoing power control to the state of undergoing power control, the method further updating the stored predistortion coefficients by using the predistortion coefficient calculated by the unit that performs predistortion coefficient adaptive updating operation at the last timing the power amplifier is not in the state of undergoing power control.

Excursus 8—the method according to Excursus 7, wherein the updating uses the predistortion coefficient calculated at the last timing to update a predistortion coefficient in the stored predistortion coefficients and corresponding to the index acquired in the acquiring at the last timing, and a predistortion coefficient adjacent thereto.

Excursus 9—a method of detecting power control state, for detecting whether a power amplifier is in a state of undergoing power control, which method comprises registering a plurality of indices which are acquired within a predetermined time period, each index indicating an output power of the power amplifier; acquiring a difference between a maximum value and a minimum value within the plurality of indices; determining, based on the difference, whether the power amplifier is in the state of undergoing power control; and outputting a signal indicating whether the power amplifier is in the state of undergoing power control.

Excursus 10—an apparatus for controlling a predistorter for predistorting a signal input into a power amplifier, which apparatus comprises a storing unit, for storing a predistortion coefficient used by the predistorter; an index acquiring unit, for acquiring indices indicative of an output power of the power amplifier; a power control state detecting unit, for detecting, based on the indices acquired by the index acquiring unit, whether the power amplifier is in a state of undergoing power control; and a coefficient supplying unit, for obtaining the stored predistortion coefficient for supply to the predistorter when the power control state detecting unit detects that the power amplifier is in the state of undergoing power control, and for supplying, when it is detected that the power amplifier is not in the state of undergoing power control, to the predistorter predistortion coefficients calculated by a unit that performs predistortion coefficient adaptive updating operation.

Excursus 11—the apparatus according to Excursus 10, wherein the power control state detecting unit includes an index register, for registering a plurality of the indices which are acquired within a predetermined time period by the index acquiring unit; a difference acquiring unit, for acquiring a difference between a maximum value and a minimum value within the plurality of indices; a determining unit, for determining, based on the difference, whether the power amplifier is in the state of undergoing power control; and an outputting unit, for outputting a signal indicating whether the power amplifier is in the state of undergoing power control.

Excursus 12—the apparatus according to Excursus 11, wherein the predetermined time is greater than or equal to a converging time of an update algorithm of the predistorter.

Excursus 13—the apparatus according to Excursus 11, wherein an output from the predistorter is input into the power amplifier via a variable gain attenuator, wherein the index acquiring unit acquires the plurality of indices by sampling an output from the variable gain attenuator.

Excursus 14—the apparatus according to Excursus 11, wherein the determining unit determines whether the difference is greater than a predetermined threshold; when the difference is greater than the predetermined threshold, it is determined that the power amplifier is in the state of undergoing power control; when the difference is not greater than the predetermined threshold, the determining unit further determines whether a plurality of the differences acquired by the difference acquiring unit within a particular time are not greater than the predetermined threshold; when it is determined that the plurality of differences acquired by the difference acquiring unit within the particular time are not greater than the predetermined threshold, the detecting unit determines that the power amplifier is not in the state of undergoing power control.

Excursus 15—the apparatus according to Excursus 10, wherein when the power control state detecting unit detects that the power amplifier is not in the state of undergoing power control, the coefficient supplying unit delivers the stored predistortion coefficients to the unit that performs predistortion coefficient adaptive updating operation, as an initial value for the unit that performs predistortion coefficient adaptive updating operation to perform the predistortion coefficient adaptive updating operation, and supplies to the predistorter the predistortion coefficient calculated by the unit that performs predistortion coefficient adaptive updating operation.

Excursus 16—the apparatus according to Excursus 10, wherein the apparatus further comprises a stored coefficient updating unit, wherein when the power control state detecting unit detects that the power amplifier changes from the state of not undergoing power control to the state of undergoing power control, the stored coefficient updating unit updates the stored predistortion coefficients by using the predistortion coefficient calculated by the unit that performs predistortion coefficient adaptive updating operation at the last timing the power amplifier is not in the state of undergoing power control.

Excursus 17—the apparatus according to Excursus 16, wherein the stored coefficient updating unit uses the predistortion coefficient calculated at the last timing to update a predistortion coefficient in the stored predistortion coefficients and corresponding to the index acquired by the index acquiring unit at the last timing, and a predistortion coefficient adjacent thereto.

Excursus 18—the apparatus according to Excursus 10, wherein the apparatus further comprises the predistorter coefficient updating unit.

Excursus 19—a program executable by a logical device, which program, when being executed, enables the logical device to implement the method or steps in the method recorded in any of Excursuses 1 to 9, or enables the logical device to serve as the apparatus or a component part in the apparatus recorded in any of Excursuses 10 to 18, wherein the logical device is a CPU, a microprocessor, a field programmable logical device, etc.

Excursus 20—a tangible storage medium readable by a logical device and storing the program recorded in Excursus 19.

All of the above-described embodiments are merely exemplary in nature, rather than restrictive to the present invention, as persons skilled in the art may conceive of various variations and modifications without departing from the principles of the present invention, and all these variations and modifications shall also be covered within the scope of the present invention.

The invention claimed is:

1. A method of controlling a predistorter for predistorting a signal input into a power amplifier, the method comprising:
    storing predistortion coefficients used by the predistorter;
    acquiring indices each representative of an output power of the power amplifier;
    detecting, based on the indices acquired in the acquiring, whether the power amplifier is in a state of undergoing power control; and
    supplying the stored predistortion coefficients to the predistorter when it is detected that the power amplifier is in the state of undergoing power control, or
    supplying, when it is detected that the power amplifier is not in the state of undergoing power control, to the predistorter predistortion coefficients calculated by a unit that performs predistortion coefficient adaptive updating operation.

2. The method according to claim 1, wherein the detecting includes:
    registering a plurality of the indices which are acquired within a predetermined time period;
    acquiring a difference between a maximum value and a minimum value within the plurality of indices;
    determining, based on the difference, whether the power amplifier is in the state of undergoing power control; and
    outputting a signal indicating whether the power amplifier is in the state of undergoing power control.

3. The method according to claim 2, wherein the predetermined time period is greater than or equal to a converging time of an update algorithm of the unit that performs predistortion coefficient adaptive updating operation.

4. The method according to claim 2, wherein an output from the predistorter is input into the power amplifier via a variable gain attenuator, wherein the plurality of indices are acquired in the acquiring by sampling an output from the variable gain attenuator.

5. The method according to claim 2, wherein it is determined in the determining whether the difference is greater than a predetermined threshold; when the difference is greater than the predetermined threshold, it is determined that the power amplifier is in the state of undergoing power control; when the difference is not greater than the predetermined threshold, it is further determined in the determining whether a plurality of the differences acquired in the acquiring within a particular time are not greater than the predetermined threshold; when it is determined that the plurality of differences acquired in the acquiring within the particular time are not greater than the predetermined threshold, it is determined in the determining that the power amplifier is not in the state of undergoing power control.

6. The method according to claim 1, wherein when it is detected in the detecting that the power amplifier is not in the state of undergoing power control, the supplying delivers the stored predistortion coefficients to the unit that performs predistortion coefficient adaptive updating operation, as an initial value for the unit that performs predistortion coefficient adaptive updating operation to perform the predistortion coefficient adaptive updating operation, and supplies to the predistorter the predistortion coefficient calculated by the unit that performs predistortion coefficient adaptive updating operation.

7. The method according to claim 6, wherein when it is detected in the detecting that the power amplifier changes from the state of not undergoing power control to the state of undergoing power control, the method further updating the stored predistortion coefficients by using the predistortion coefficient calculated by the unit that performs predistortion coefficient adaptive updating operation at the last timing the power amplifier is not in the state of undergoing power control.

8. The method according to claim 7, wherein the updating uses the predistortion coefficient calculated at the last timing to update a predistortion coefficient in the stored predistortion coefficients and corresponding to the index acquired in the acquiring at the last timing, and a predistortion coefficient adjacent thereto.

9. A method of detecting power control state for detecting whether a power amplifier is in a state of undergoing power control, the method comprising:
    registering a plurality of indices which are acquired within a predetermined time period, each representative of an output power of the power amplifier;
    acquiring a difference between a maximum value and a minimum value within the plurality of indices;
    determining, based on the difference, whether the power amplifier is in the state of undergoing power control; and
    outputting a signal indicating whether the power amplifier is in the state of undergoing power control.

10. An apparatus for controlling a predistorter for predistorting a signal input into a power amplifier, the apparatus comprising:
- a storing unit, for storing a predistortion coefficient used by the predistorter;
- an index registering unit, for acquiring indices representative of an output power of the power amplifier;
- a power control state detecting unit, for detecting, based on the indices acquired by the index registering unit, whether the power amplifier is in a state of undergoing power control; and
- a coefficient supplying unit, for obtaining the stored predistortion coefficient for supplying to the predistorter when the power control state detecting unit detects that the power amplifier is in the state of undergoing power control, and for supplying, when it is detected that the power amplifier is not in the state of undergoing power control, to the predistorter predistortion coefficients calculated by a unit that performs predistortion coefficient adaptive updating operation.

* * * * *